United States Patent
Drechsler et al.

(10) Patent No.: US 9,535,101 B2
(45) Date of Patent: Jan. 3, 2017

(54) REVERSE CURRENT DETECTOR CIRCUIT

(71) Applicant: EM Microelectronic-Marin SA, Marin (CH)

(72) Inventors: Petr Drechsler, Jesenice (CZ); Yves Theoduloz, Yverdon (CH)

(73) Assignee: EM Microelectronic-Marin SA, Marin (CH)

( * ) Notice: Subject to any disclaimer, the term of this patent is extended or adjusted under 35 U.S.C. 154(b) by 95 days.

(21) Appl. No.: 14/552,724

(22) Filed: Nov. 25, 2014

(65) Prior Publication Data
US 2015/0146329 A1    May 28, 2015

(30) Foreign Application Priority Data
Nov. 26, 2013 (EP) ..................... 13194504

(51) Int. Cl.
*H02H 3/18* (2006.01)
*G01R 19/14* (2006.01)
*H02M 3/158* (2006.01)
*G01R 19/00* (2006.01)
*H02H 7/12* (2006.01)

(52) U.S. Cl.
CPC ........... *G01R 19/14* (2013.01); *G01R 19/0092* (2013.01); *H02H 3/18* (2013.01); *H02H 7/1213* (2013.01); *H02M 3/158* (2013.01)

(58) Field of Classification Search
CPC ....... G01R 19/14; G01R 19/0092; H02H 3/18; H02H 7/1213
USPC ........................................................ 361/18
See application file for complete search history.

(56) References Cited

U.S. PATENT DOCUMENTS

2006/0113980 A1* 6/2006 Yoshida ............. H02M 3/1588
                                                    323/282
2009/0237039 A1  9/2009 Heim et al.
2013/0169248 A1  7/2013 Zhang et al.

OTHER PUBLICATIONS

European Search Report issued May 14, 2014 in European Application 13194504, filed on Nov. 26, 2013.

* cited by examiner

*Primary Examiner* — Scott Bauer
(74) *Attorney, Agent, or Firm* — Oblon, McClelland, Maier & Neustadt, L.L.P.

(57) ABSTRACT

A circuit (1) is described for detecting a reverse current condition of a DCDC converter (2). This circuit uses a simple logic gate such as an AND gate to sense the voltage on a determined node (7) of the DCDC converter, and the propagation of the gated signal (27) is controlled using the timing control signals SW1 and SW2 of the DCDC converter, together with delay cells (16 and 17), to ensure that the positive or negative state of the sensed voltage at said node (7) is propagated cleanly through the logic gate (18), the flip-flop or latch circuit (19) and the up-down counter (29) to the output timing control circuit (25). The up-down counter is incremented or decremented in dependence on the presence or absence of a reverse current condition at said node, and the count value (24) of the up-down counter determines the duration of the on-period of the second-phase timing control signal SW2.

15 Claims, 1 Drawing Sheet

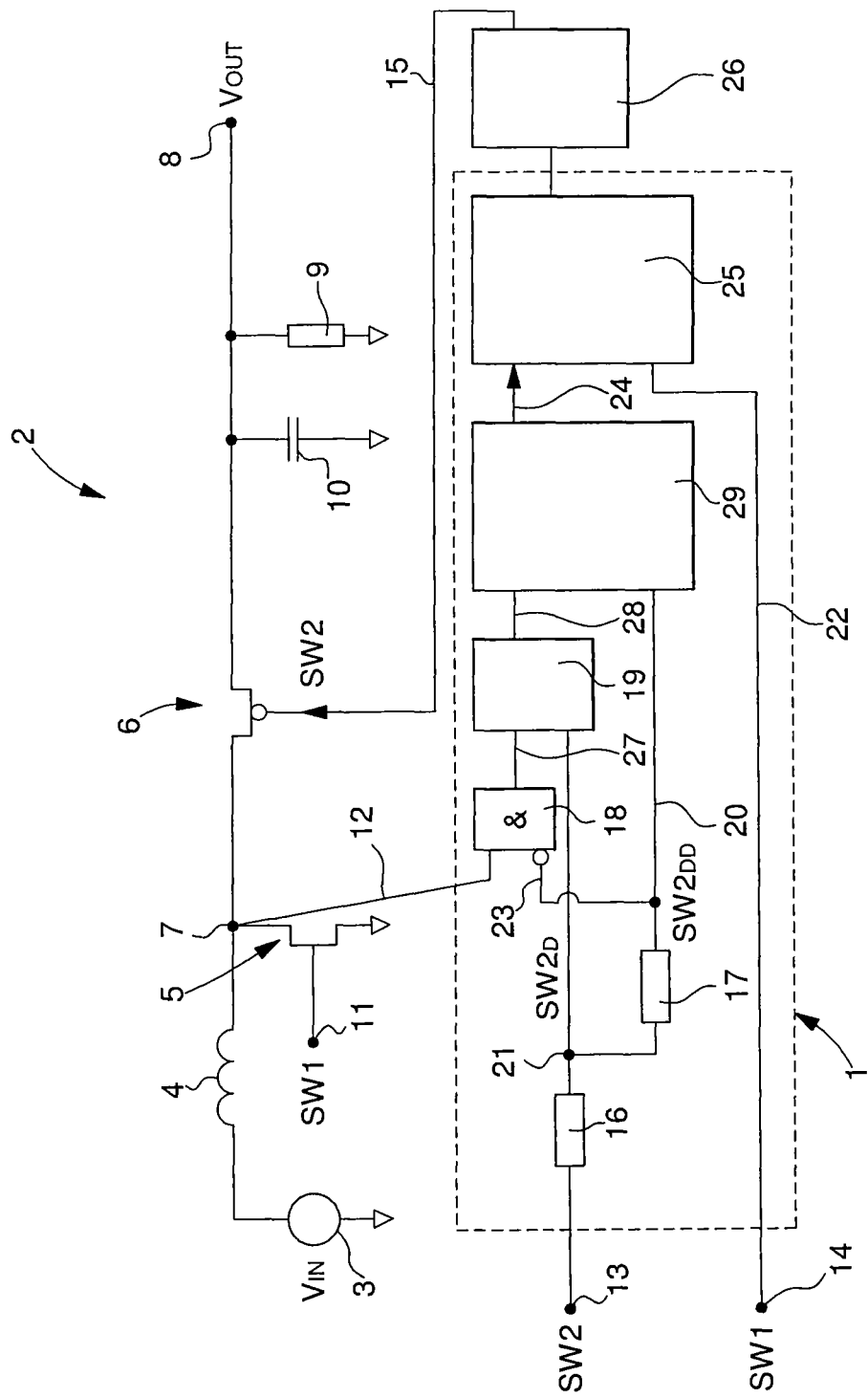

REVERSE CURRENT DETECTOR CIRCUIT

This application claims priority from European patent application No. 13194504.0 filed Nov. 26, 2013, the entire disclosure of which is hereby incorporated by reference.

TECHNICAL FIELD

The invention relates to the field of DCDC converters and, in particular, but not exclusively, to low-power boost DCDC converters which can operate in discontinuous mode.

BACKGROUND OF THE INVENTION

DCDC converters are used to convert a first DC voltage into a second, usually higher, DC voltage. This may be achieved by applying the first DC voltage to an inductance, and varying or switching the current which flows in the inductance so as to produce a series of higher-magnitude positive-going and negative-going voltage peaks which are then rectified and smoothed by an output capacitor, and output as the second DC voltage to an output load. At certain points in the switching cycle, the circuit may enter a state in which current flows in the reverse direction. Such reverse current is undesirable, because it results in increased power loss. The effects of reverse current are particularly significant in low-power DCDC converters, in which the power loss due to the reverse current may be comparable to or even greater than the power transferred from the input to the output of the converter.

In order to avoid a reverse current condition, while still maximizing the power transfer through the converter, DCDC converters have been proposed which aim to achieve optimum switching timing by dynamically tuning the control timing signals in response to a cyclic variation in voltage at the sensing node of the DCDC converter circuit. For example, the voltage may be sensed at a predetermined time at the end of each forward current (second) phase, and, if no reverse current is detected, the duration of the next forward current flow phase can be increased slightly. If a reverse current is then detected, the duration of the next forward current phase is decreased again slightly. In this way, the DCDC converter switching timing control converges to the desirable situation in which the transition from one phase to the next occurs when there is zero current flowing in the converter. In DCDC converters with a cycle frequency of tens or hundreds of kilohertz, this convergence happens rapidly.

Existing reverse current detectors typically use an analog comparator for sensing voltage. However, comparators in principle require a constant bias current to operate, which increases the current consumption of the reverse current detector. Current consumption of such a comparator is not negligible in low-power converters, and especially at higher operating frequencies of hundreds of kilohertz.

In US2009/0237039A1 it was suggested to connect the reverse current sensing node of a DCDC converter operating in discontinuous mode to the non-inverting input of a flip-flop circuit in a reverse current detector. However, this arrangement also implies a not negligible current consumption in the flip-flop circuit, not least because the new value of the sensed voltage must be clocked through the flip-flop for every cycle.

SUMMARY OF THE INVENTION

It is an aim of the present invention to overcome at least some of the above disadvantages of prior art reverse current detector circuits. In particular, the invention aims to provide a reverse current detector circuit which consumes less power than prior art reverse current detectors.

To this end, the invention concerns a reverse current detector circuit for a DCDC converter, the reverse current detector circuit comprising:
- a sensing input connected to a reverse-current sensing node of the DCDC converter,
- a timing control output of a timing control circuit arranged for controlling a current-flow sequence timing of the DCDC converter, and
- a flip-flop circuit (19) for providing to the timing control circuit the direction of a residual current at said reverse-current sensing node.

The reverse current detector circuit is characterized in that it comprises a logic gate having a gate output connected to a data input of the flip-flop circuit, a first gate input connected to the sensing input and a second gate input receiving an input gating signal, and in that the logic gate is configured and connected such that, while the input gating signal has a first logic value, the logic state of the gate output depends on the first gate input and, when the input gating signal has a second logic value, the logic gate circuit is in a powered-down state such that the logic state of the gate output is independent of the first gate input.

The logic gate is in a first embodiment an 'AND' gate. In another embodiment not further described, the logic gate is an 'OR' gate. A person skilled in the art will be able to design this last embodiment based on the teaching given in the present description of the invention. Further variants of the inventive envelope detector circuit are described in the dependent claims.

As will be discussed below, the use of a simple logic gate, such as an AND gate, to gate the reverse current sensing voltage into the reverse current detector circuit means that the input stage can effectively be powered down for the majority of the DCDC converter's switching cycle, i.e. the voltage signal received at this input stage can be without effect for/not further transmitted to the flip-flop circuit when both main switches of the DCDC converter are not conductive (OFF), with the exception of a short portion of the switching cycle in which the reverse-current sensing takes place. In this way, it is possible to significantly reduce the time during which power is required to operate the flip-flop circuit of the reverse current detector circuit, and thereby reduce the overall power consumption of the reverse current detector circuit. Indeed, the flip-flop circuit generally increases its power consumption when the voltage signal at its data input does not correspond to a well-defined logical state '0' or '1'. This is the case for the voltage at the reverse-current sensing node, after a short period, when both main switches of the DCDC converter are OFF. In said short period, depending on the direction of a residual current at the reverse-current sensing node, the voltage at this node increases or strongly decreases so that, during this short period, the voltage at the sensing input of the reverse current detector circuit corresponds to a meaningful logical value. This is the input signal which is used for detecting the direction of a residual current at the reverse-current sensing node, and thus which is transmitted to the flip-flop circuit. After this short period, the voltage of the input signal received at the sensing input generally oscillates around a non-meaningful logical value. The reverse current detector circuit of the present invention is arranged so that such an oscillating signal and a non-meaningful logical value is not transmitted to the flip-flop circuit. The construction of the logic gate is made in such a way there is no over consumption into this logic gate when the second gate input has a logic value forcing the gate output to logic value independent to the first gate input (sensing input).

BRIEF DESCRIPTION OF THE DRAWINGS

The invention will now be described in more detail with reference to the accompanying drawing, FIG. 1, which shows an embodiment of a reverse current detector circuit according to the invention.

It should be noted that the drawing is provided as an aid to understanding certain principles underlying the invention, and should not be taken as implying any limitation in the scope of protection sought. Where the same reference signs have been used in more than place in the FIGURE, these are intended to refer to the same or corresponding features. However, the use of different reference signs should not be taken as implying a difference between the features to which the signs refer.

Note that, while the example of a boost converter has been used in this application, it will be recognized that the principles of the invention can be applied to reverse current detection in other types of converter. Note also that the terms OFF and ON state used in this application do not necessarily indicate a particular signal voltage. Rather, they indicate a particular logic state.

DETAILED DESCRIPTION OF EMBODIMENTS OF THE INVENTION

FIG. 1 shows a boost DCDC converter which includes an inductive coil 4, a synchronous rectifier arrangement formed by switches 5 and 6 and an output capacitor 10. Energy from the input voltage source 3 is converted from an input voltage $V_{IN}$ to a different output voltage $V_{OUT}$ at output terminal 8, across output load 9. DCDC converters in principle operate in 3 modes—continuous, discontinuous and OFF mode. Continuous mode is characterized by continuous coil current. In discontinuous mode the current in the coil is interrupted and reverse current condition can arise. The present invention concerns this discontinuous mode.

The reverse current detector circuit 1 shown in FIG. 1 is arranged to sense the voltage at the common connection 7 of the coil 4 and the switches 5 and 6 in the synchronous rectifier. This common connection 7 is also referred to in this application as the reverse current sensing node or sensing node. Current flowing in the coil 4 must flow from the input voltage source 3 to the output load 9, otherwise a reverse current condition exists. Such a reverse current increases the power consumption and therefore must be avoided. In order to determine which way the current is flowing at the end of the second phase of each switching cycle of the DCDC converter, both switches 5 and 6 are switched off (OFF state), and the voltage at the sensing node 7 is monitored by the reverse current detector circuit 1. If the voltage at the sensing node 7 rises, the current is in forward direction, and if the voltage drops, a reverse current condition exists.

The timing control circuit 29 & 25 ensures that second-phase switch 6 is switched OFF while first-phase switch 5 is ON during the first phase of the timing cycle of the DCDC converter. After the first phase, second-phase switch 6 is switched ON and the second phase of the timing cycle takes place, and then second-phase switch 6 is switched OFF again after a time period determined by the timing control circuit. Switch driver circuit 26 is arranged for boosting the control signal generated by the analog delay cell 25 and for providing at its output a control signal SW2 to second-phase switch 6 and to a first timing control input 13 of the reverse current detector circuit 1. A further timing control signal SW1 is provided at a second timing control input 14 of the reverse current detector circuit 1 and in particular to first-phase switch 5.

As shown in FIG. 1, the reverse current detector uses a simple logic gate for sensing the voltage on circuit node 7. A logic gate consumes significantly less current than a comparator, for example. The AND gate 18, used for sensing the voltage on sensing node 7, can be effectively powered down for the majority of the timing cycle, in the variant shown in FIG. 1 when the second-phase timing control signal SW2 is high. In the present invention, the analog signal provided by sensing node 7 is converted into a logic value by the logic gate and then provided to a flip-flop circuit 19. The prior art solutions with a comparator or a direct connection to a flip-flop circuit require a significant current consumption and cannot be powered down as this the case with an AND gate according to the present invention.

The duration of the SW2 ON time period is set by means of a programmable analog delay cell 25. This analog delay cell issues a timing control signal SW2 whose ON time is controlled by the count value 24 outputted from the up-down counter 29. A higher value count means a longer ON period, whereas a lower value means a shorter ON period. To save power, the analog delay cell 25 is enabled only during the second phase of the DCDC converter cycle, when the timing control signal SW1 is OFF. The use of an analog timing generator in itself also helps to reduce power consumption, since it does not require a high speed clock for controlling the SW2 ON time. The reverse current detector circuit 1 may thus operate without the need for any high-speed oscillator signal, and may take all its timing information from the timing control signals of the DCDC converter 2.

Initially, after a reset, the ON period of second-phase timing control signal SW2 has its shortest value, and the count value 24 is typically zero. During the first phase, when the first-phase timing signal SW1 is ON, the current in the coil 4 rises. Then, during the second phase, when the second-phase timing control signal SW2 is ON, the coil 4 is connected in series to the voltage source 3, and current is delivered to the output load 9. The current falls during this second phase. At the end of the second phase, the second-phase timing control signal SW2 rises, and both switches 1 and 2 are switched OFF (SW1=0 and SW2=1 in FIG. 1). The voltage level at circuit node 7 is sensed by AND gate 18 and gated through to the data input of flip-flop circuit 19. The resulting logic value at the output of logic gate 18 is then clocked into and stored in flip-flop 19 by a rising edge of the delayed signal $SW2_D$, which is a time-delayed version of SW2. The delay of $SW2_D$ is achieved by means of a delay cell 16 and is included in order to prevent $SW2_D$ from going high until SW2 is fully OFF and the voltage at 7 has settled to a meaningful value.

An extra delay cell provides a further delay on the gating input of AND gate 18, thereby holding the AND gate 18 in its sensing or open state a little longer. This extra delay serves to ensure the hold time of the flip-flop 19 and the setup time of up-down counter 29. When SW2 is switched OFF, AND gate 18 retains enough charge to stay in a defined logic state but with no power consumption. Forward current in the coil 4 causes the voltage at circuit node 7 to rise when SW1 and SW2 are switched OFF at the end of the second phase, with the result that the output of the AND gate 18 has a logic value of '1'. The up-down counter 29 is incremented and the ON period defined by the analog delay cell 25 is increased. This sequence repeats every cycle until a reverse current is detected, at which point the voltage at circuit node 7 falls due to the reverse current, the output of AND gate 18 goes low, and the flip-flop 19 stores a logical '0'. The up-down counter 29 is thus decremented and the analog delay cell 25 shortens the duration of SW2 a little to avoid reverse current in next cycle. Because of the shortened duration of SW2 in the next cycle, a forward current condition is normally present when the voltage at circuit node 7 is further sensed. Note that the flip-flop 19 may alternatively be replaced by another type of circuit which is capable of latching its input to its output. The AND gate may advantageously be implemented using an NMOS transistor arranged as a pass-through gate in known fashion, or in other known configurations in which the gate's power consumption is effectively zero when the gate signal is in its OFF state.

The up-down counter 29 may advantageously be provided with further energy-saving feature in that, once the up-down counter has been decremented, it is configured to power down for a predetermined number of timing cycles before it starts to operate again and adjust the count value 24 in response to the output up of the flip-flop 19. In other words, as soon as the count value changes from N to N−1 and back to N, the logic stops the counter for M periods. This measure helps to increase efficiency in that it ensures a rapid initial convergence to the zero-switching condition, but then, once the reverse current detector has achieved convergence, allows the maintenance of the convergence condition to be carried out much less frequently than every cycle.

What is claimed is:

1. A reverse current detector circuit for a DCDC converter, the reverse current detector circuit comprising:
    a sensing input connected to a reverse-current sensing node of the DCDC converter;
    a timing control output of a timing control circuit arranged for controlling a current-flow sequence timing of the DCDC converter;
    a flip-flop circuit providing to the timing control circuit the direction of a residual current at said reverse-current sensing node;
    a logic gate having a gate output connected to a data input of the flip-flop circuit;
    a first gate input connected to the sensing input;
    a second gate input receiving an input gating signal;
    a first timing control input receiving a first timing control signal of the DCDC converter;
    a first delay means for providing a first delayed timing signal by delaying the first timing control signal by a first delay period;
    an up-down counter forming said timing control circuit,
    wherein the logic gate is configured and connected such that, while the input gating signal has a first logic value, the logic state of the gate output depends on the first gate input and, when the input gating signal has a second logic value, a logic gate circuit is in a powered-down state such that the logic state of the gate output is independent of the first gate input, and
    wherein the up-down counter is clocked by the first delayed timing signal to increment a count value if the gate output is in a first gate output logic state when the up-down counter is clocked by the first delayed timing signal changing to a first clocking logic state, and to decrement the count value if the gate output is in a second gate output logic state when the up-down counter is clocked by the first delayed timing signal changing to the first clocking logic state.

2. The reverse current detector circuit according to claim 1, wherein the up-down counter is configured to enter a powered-down state when the first delayed timing signal has a second clocking logic state.

3. The reverse current detector circuit according to claim 1, wherein the input gating signal is the first delayed timing signal.

4. The reverse current detector circuit according to claim 1, wherein the up-down counter comprises count-override means for detecting a convergence condition of the reverse current detector circuit and for putting the up-down counter in a powered-down mode for a predetermined time period.

5. The reverse current detector circuit according to claim 4, wherein the convergence condition comprises an increment-decrement-increment or a decrement-increment-increment sequence of the up-down counter.

6. The reverse current detector circuit according to claim 1, further comprising:
    a second delay means for generating a second delayed timing signal by delaying the first timing control signal by a second delay period which is shorter than the first delay period.

7. The reverse current detector circuit according to claim 1, wherein the logic gate is formed by an AND gate.

8. The reverse current detector circuit according to claim 1, wherein said timing control circuit comprises the output timing control circuit configured to generate an output timing control signal for controlling a second phase timing of the DCDC converter, the output timing control signal having a control period which is dependent on the count value.

9. The reverse current detector circuit according to claim 1, wherein the flip-flop circuit is arranged to store the gate output during a second delay period, under the control of a second delayed timing signal, and
    wherein the up-down counter is clocked by the first delayed timing signal to increment the count value if the flip-flop circuit output is in the first gate output logic state when the up-down counter is clocked, and to decrement the count value if a latched gate output is in the second gate output logic state when the up-down counter is clocked.

10. The reverse current detector circuit according to claim 8, wherein the output timing control circuit comprises an analog delay cell.

11. The reverse current detector circuit according to claim 8, wherein the output timing control circuit receives an output circuit control signal, and
    wherein the output timing control circuit is configured to, when the output circuit control signal is in a predetermined logic state, enter a powered-down state.

12. The reverse current detector circuit according to claim 11, wherein the output circuit control signal is a second timing control signal of the DCDC converter.

13. A DCDC converter comprising:
    a reverse current detector circuit according to claim 1,
    a reactive element,
    a first switching element controlled by the first timing control signal with a second phase timing, and a second switching element controlled by a second timing control signal with a first phase timing,
    wherein the second phase timing is controlled by the output timing control circuit, and wherein the second timing control signal is an output circuit control signal.

14. A DCDC converter comprising:
    a reverse current detector circuit according to claim 7,
    a reactive element, a first switching element controlled by the first timing control signal with a second phase timing, and a second switching element controlled by a second timing control signal with a first phase timing, wherein the second phase timing is controlled by the output timing control circuit, and wherein the second timing control signal is an output circuit control signal.

15. A reverse current detector circuit for a DCDC converter, the reverse current detector circuit comprising:

a sensing input connected to a reverse-current sensing node of the DCDC converter;

a timing control output of a timing control circuit configured to control a current-flow sequence timing of the DCDC converter;

a flip-flop circuit providing to the timing control circuit the direction of a residual current at said reverse-current sensing node;

a logic gate having a gate output connected to a data input of the flip-flop circuit;

a first gate input connected to the sensing input;

a second gate input receiving an input gating signal;

a first timing control input receiving a first timing control signal of the DCDC converter;

a first delay circuit configured to provide a first delayed timing signal by delaying the first timing control signal by a first delay period;

an up-down counter forming said timing control circuit, wherein the logic gate is configured and connected such that, while the input gating signal has a first logic value, the logic state of the gate output depends on the first gate input and, when the input gating signal has a second logic value, a logic gate circuit is in a powered-down state such that the logic state of the gate output is independent of the first gate input, and wherein the up-down counter is clocked by the first delayed timing signal to increment a count value if the gate output is in a first gate output logic state when the up-down counter is clocked by the first delayed timing signal changing to a first clocking logic state, and to decrement the count value if the gate output is in a second gate output logic state when the up-down counter is clocked by the first delayed timing signal changing to the first clocking logic state.

* * * * *